(12) United States Patent
Choi et al.

(10) Patent No.: US 8,932,899 B2
(45) Date of Patent: Jan. 13, 2015

(54) FLEXIBLE DISPLAY DEVICE MANUFACTURING METHOD

(71) Applicant: Samsung Display Co., Ltd., Yongin, Gyeonggi-Do (KR)

(72) Inventors: Jung-Ho Choi, Yongin (KR); Sang-Hun Oh, Yongin (KR); Dong-Wook Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 7 days.

(21) Appl. No.: 13/859,335

(22) Filed: Apr. 9, 2013

(65) Prior Publication Data
US 2014/0099743 A1    Apr. 10, 2014

(30) Foreign Application Priority Data
Oct. 4, 2012   (KR) .......................... 10-2012-0110094

(51) Int. Cl.
| | | |
|---|---|---|
| H01L 31/18 | (2006.01) | |
| H01L 31/042 | (2014.01) | |
| H01L 33/02 | (2010.01) | |
| G06F 1/16 | (2006.01) | |

(52) U.S. Cl.
CPC .............. H01L 33/02 (2013.01); G06F 1/1652 (2013.01)
USPC ........................................... 438/98; 136/249

(58) Field of Classification Search
None
See application file for complete search history.

(56) References Cited

U.S. PATENT DOCUMENTS

| | | | | |
|---|---|---|---|---|
| 5,320,680 A | * | 6/1994 | Learn et al. .................... | 118/724 |
| 2010/0025831 A1 | * | 2/2010 | Yamazaki et al. ............ | 257/679 |
| 2012/0227790 A1 | * | 9/2012 | Auman et al. ................. | 136/249 |
| 2013/0102110 A1 | * | 4/2013 | Leschkies et al. .............. | 438/98 |

FOREIGN PATENT DOCUMENTS

| | | |
|---|---|---|
| JP | 2011-027822 | 2/2011 |
| KR | 10-2007-0080763 | 8/2007 |
| KR | 10-2008-0091964 | 10/2008 |
| KR | 10-2011-0065077 | 6/2011 |
| KR | 10-2012-0033285 | 4/2012 |

* cited by examiner

*Primary Examiner* — Zandra Smith
*Assistant Examiner* — Pamela E Perkins
(74) *Attorney, Agent, or Firm* — Robert E. Bushnell, Esq.

(57) ABSTRACT

A flexible display device manufacturing method includes preparing a substrate assembly in which a flexible substrate is formed on a carrier substrate; piling up a plurality of the prepared substrate assemblies in a heating furnace in multi-stages; performing heat treatment by providing hot blast onto each of the piled substrate assemblies in a horizontal direction; forming a display unit on the flexible substrate of the heat-treated substrate assembly; and separating the flexible substrate and the carrier substrate from each other. According to the above-described manufacturing method, since warpage of a flexible substrate after a carrier substrate and the flexible substrate are separated from each other may be suppressed, a subsequent process may be appropriately performed, productivity may be improved, and damage of products caused while the flexible substrate is handled may be reduced.

16 Claims, 4 Drawing Sheets

FLEXIBLE DISPLAY DEVICE MANUFACTURING METHOD

CLAIM PRIORITY

This application makes reference to, incorporates the same herein, and claims all benefits accruing under 35 U.S.C. §119 from an application earlier filed in the Korean Intellectual Property Office on 4 Oct. 2012 and there duly assigned Serial No. 10-2012-0110094.

BACKGROUND OF THE INVENTION

1. Field of the Invention

The present invention generally relates to a flexible display device manufacturing method.

2. Description of the Related Art

Display devices such as organic light emitting display devices may have a small thickness and have flexibility due to their driving characteristics and thus research is being actively conducted on them.

Currently, flexible display devices in which a display unit is formed on a flexible substrate attract attention.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides a flexible display device manufacturing method capable of suppressing warpage of a flexible substrate after a carrier substrate and the flexible substrate are separated from each other.

According to an aspect of the present invention, there is provided a flexible display device manufacturing method including preparing a substrate assembly in which a flexible substrate may be formed on a carrier substrate; piling up a plurality of the prepared substrate assemblies in a heating furnace in multi-stages; performing heat treatment by providing hot blast onto each of the piled substrate assemblies in a horizontal direction; forming a display unit on the flexible substrate of the heat-treated substrate assembly; and separating the flexible substrate and the carrier substrate from each other.

In the performing of the heat treatment, the hot blast may pass along a flat surface of the flexible substrate of each of the piled substrate assemblies while forming a laminar flow.

In the performing of the heat treatment, a temperature of the hot blast may be gradually increased.

The temperature of the hot blast may be gradually increased to a first temperature less than 150° C., to a second temperature equal to or greater than 150° C. and less than 300° C., and to a third temperature equal to or greater than 300° C.

The flexible substrate may include a polyimide material, and the carrier substrate may include a glass material.

The method may further include performing post-processing for re-heating the flexible substrate after the flexible substrate and the carrier substrate are separated from each other.

The post-processing may include direct heating for allowing a heat source to directly contact the flexible substrate, or indirect heating for putting the flexible substrate in a high-temperature atmosphere for a certain period of time.

The direct heating may be performed by putting the flexible substrate on a hot plate heated to 50 to 150° C., for 1 to 10 min.

The indirect heating may be performed by putting the flexible substrate in an oven that may be maintained at 50 to 150° C., for 1 to 5 min.

The post-processing may be selectively performed if warpage of the flexible substrate after the carrier substrate and the flexible substrate are separated from each other may be caused.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
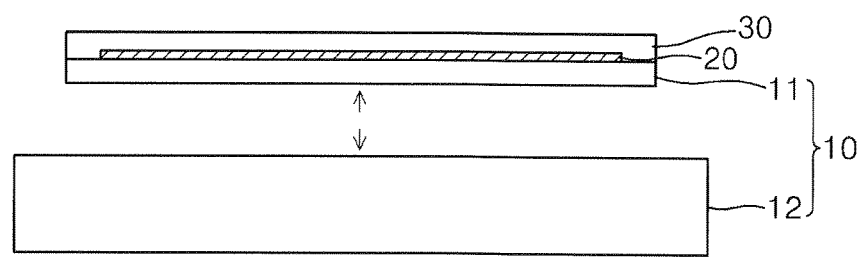
FIG. 1 is a cross-sectional view of a flexible display device according to an embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a flexible display device is manufactured, in general, a flexible substrate is formed by coating a flexible material such as polyimide on a hard carrier substrate, a display unit is formed on the flexible substrate, and then the carrier substrate and the flexible substrate are separated from each other.

However, in many cases, after the carrier substrate and the flexible substrate are separated from each other, the flexible substrate having a small thickness may not be spread flat and may be warped due to compressive stress. This causes a problem in handling a product in a subsequent process and thus a solution thereof is demanded.

FIG. 1 is a cross-sectional view of a flexible display device according to an embodiment of the present invention.

The flexible display device according to the current embodiment has a structure in which a flexible substrate 11 formed of a polyimide material, a display unit 20 for displaying an image, and an encapsulation substrate 30 for sealing the display unit 20 are sequentially stacked on one another. In more detail, a flexible structure in which the display unit 20 may be sealed with the flexible substrate 11 formed of an extremely thin polyimide material and the encapsulation substrate 30 formed as a thin film, instead of a conventional thick and hard glass substrate.

Accordingly, in comparison to a conventional typical structure in which a thick glass substrate surrounds top and bottom surfaces of the display unit 20, flexibility may be greatly increased and an image may be displayed while a screen may be bent.

However, since the flexible substrate 11 may not be easily handled due to its flexible characteristics, the flexible substrate 11 forms a substrate assembly 10 together with a carrier substrate 12 formed of a hard glass material during a manufacturing process so as to be carried together, and then may be separated from the carrier substrate 12 after the encapsulation substrate 30 may be completely formed.

The display unit 20 may be a unit including a thin film transistor (TFT) (not shown) and an emission layer (not shown) and for displaying an image. In FIG. 1, the display unit 20 is schematically illustrated.

The encapsulation substrate 30 may be a dampproof layer for preventing penetration of moisture from an external environment, may be formed as, for example, a thin film layer in which a multilayer of SiO/SiN and transparent polyimide are stacked one another, and may have a thickness of only 1 to 10 μm.

The flexible display device having the above structure may be manufactured as described below.

Figure 2A:
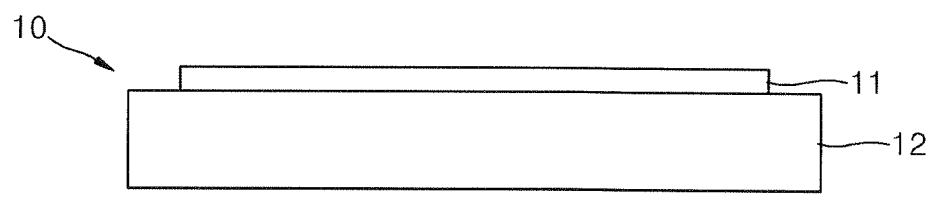
FIGS. 2A through 2G are cross-sectional views for describing a method of manufacturing the flexible display device illustrated in FIG. 1, according to an embodiment of the present invention.

Initially, the carrier substrate 12 formed of a glass material may be prepared and polyimide may be coated thereon to form the flexible substrate 11. Then, as illustrated in FIG. 2A, the substrate assembly 10 in which the flexible substrate 11 adheres to the carrier substrate 12 may be formed.

Figure 2B:
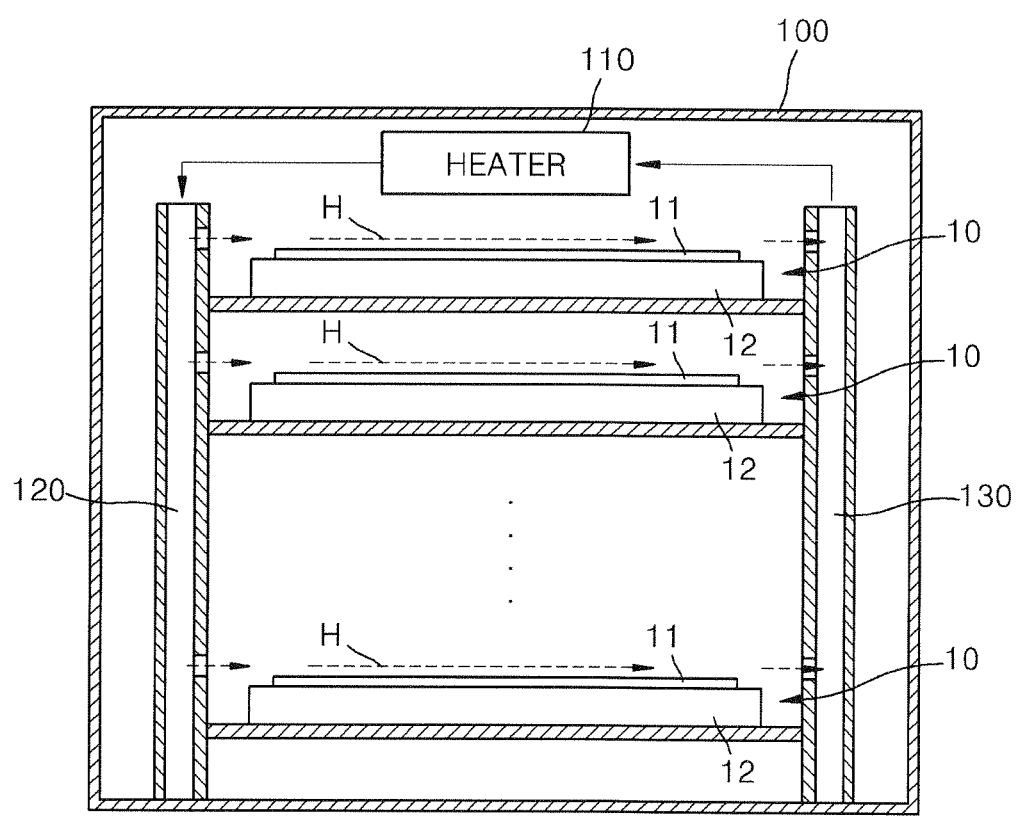

After that, a plurality of substrate assemblies 10 formed as described above are piled up in a heating furnace 100 in multi-stages as illustrated in FIG. 2B. In the heating furnace 100, hot blast H heated by the heater 110 may be circulated. In more detail, the hot blast H discharged from the heater 110 may be circulated while it may be spread by a hot blast outlet pipe 120 and may be collected by a hot blast inlet pipe 130. In this case, the hot blast H passes along a flat surface of each of the piled substrate assemblies 10 while forming a laminar flow. Accordingly, uniform heat treatment may be performed on a whole surface of each individual substrate assembly 10 over the entire substrate assemblies 10. If a convection flow may be formed instead of a laminar flow, uniform heat treatment may not be performed on a whole surface of each individual substrate assembly 10 and a deviation in degrees of heating may be increased according to locations of the substrate assemblies 10. However, if the hot blast H heats the substrate assemblies 10 while forming a laminar flow, as described above, uniform heat treatment may be performed on a whole surface of each individual substrate assembly 10 over the entire substrate assemblies 10. If heat treatment may be performed in the heating furnace 100 as described above, the flexible substrate 11 of each substrate assembly 10 may have uniform thermal expansion coefficients and a deviation in thermal expansion coefficients of a plurality of flexible substrates 11 may be reduced. Accordingly, internal stress may be reduced due to uniform heat treatment and thus warpage of the flexible substrate 11 may be reduced after the carrier substrate 12 may be separated later. Also, the flexible substrates 11 of the entire substrate assemblies 10 may have almost similar thermal expansion coefficients and thus separation conditions for preventing warpage may be easily set.

In this case, since the flexible substrate 11 formed of a polyimide material may have bubbles if hot blast having an excessively high temperature is abruptly provided, the temperature of hot blast may be gradually increased. For example, the temperature of hot blast may be adjusted in such a way that, initially, hot blast having a temperature less than 150° C. may be provided to evaporate a solvent contained in polyimide (primary heating), then, hot blast having a temperature equal to or greater than 150° C. and less than 300° C. may be provided to completely dry polyimide (secondary heating), and, lastly, hot blast having a temperature equal to or greater than 300° C. may be provided to thermally stabilize polyimide and to achieve uniform thermal expansion coefficients (tertiary heating).

Figure 2C:
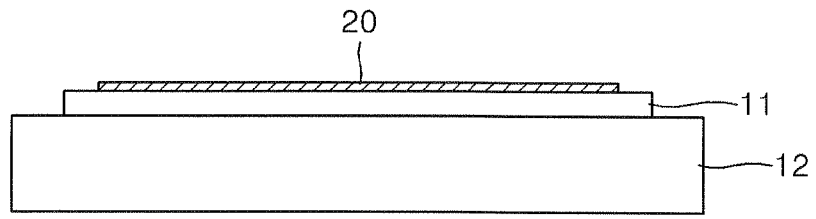

After heat treatment is completed as described above, as illustrated in FIG. 2C, the display unit 20 may be formed on the flexible substrate 11.

Figure 2D:
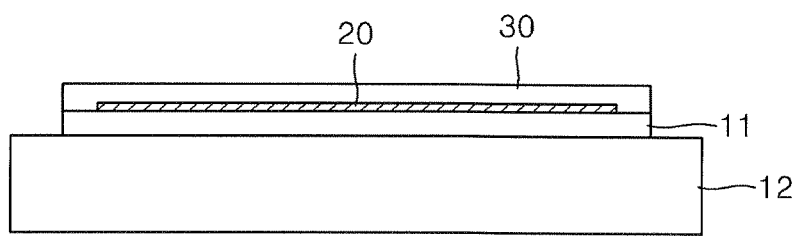

Then, as illustrated in FIG. 2D, the encapsulation substrate 30 may be formed on the display unit 20 to seal the display unit 20.

Figure 2E:
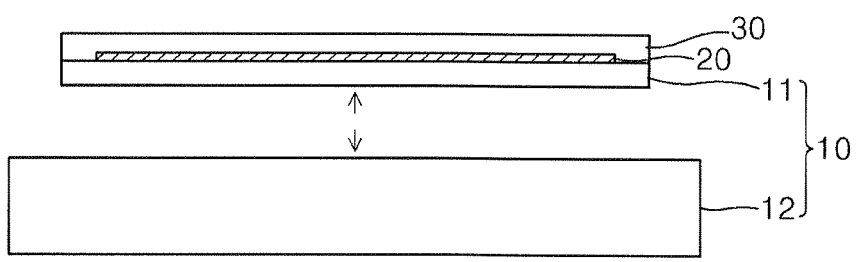

After that, as illustrated in FIG. 2E, the carrier substrate 12 and the flexible substrate 11 are separated from each other. For example, if an ultraviolet laser is irradiated onto a whole surface of the carrier substrate 12, separation occurs at a boundary surface between the carrier substrate 12 formed of a glass material and the flexible substrate 11 formed of a polyimide material due to pyrolysis between the two layers. Accordingly, as illustrated in FIG. 2E, the carrier substrate 12 may be separated and the flexible substrate 11 remains as a base substrate. In this case, since internal stress of the flexible substrate 11 may be removed and each or all of the individual flexible substrates 11 have uniform thermal expansion coefficients due to the above-described heat treatment, warpage due to stress of the flexible substrate 11 after the carrier substrate 12 may be separated may be greatly reduced. Also, since all heat-treated substrate assemblies 10 are in a uniform state, conditions for irradiating an ultraviolet laser to appropriately perform separation may be easily set.

However, although heat treatment is performed by using hot blast as described above, warpage may slightly occur after the carrier substrate 12 may be separated. If the warpage does not cause a problem in handling the flexible substrate 11 in a subsequent process, it does not matter. Otherwise, post-processing may be additionally performed.

The post-processing may be performed by using direct heating for allowing a heat source to directly contact the flexible substrate 11, or indirect heating for putting the flexible substrate 11 in a high-temperature atmosphere for a certain period of time.

Figure 2F:
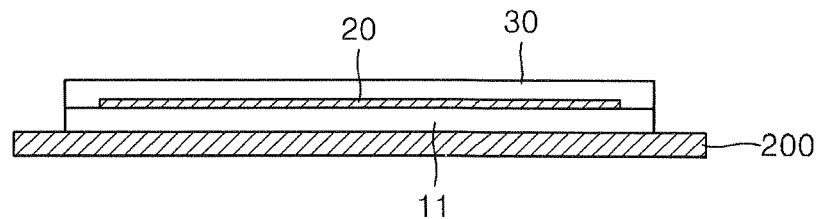

The direct heating may be performed, as illustrated in FIG. 2F, by putting the flexible substrate 11 on a heated hot plate 200 and heating it to release its stress. For example, the hot plate 200 may be heated to about 50 to 150° C. and the flexible substrate 11 may be put thereon for 1 to 10 min. Then, internal stress of the warped flexible substrate 11 may be released to spread the flexible substrate 11 flat.

Figure 2G:
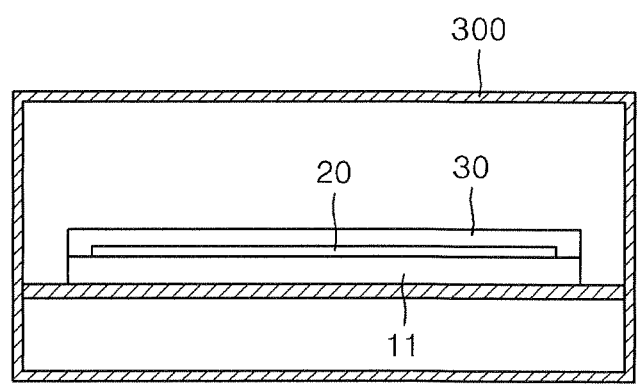

The indirect heating may be performed, as illustrated in FIG. 2G, by putting the flexible substrate 11 in an oven 300 that may be maintained at about 50 to 150° C., for 1 to 5 min. As in the direct heating, internal stress of the warped flexible substrate 11 may be released to spread the flexible substrate 11 flat.

By using the above manufacturing method, the flexible display device surrounded by the flexible substrate 11 and the encapsulation substrate 30 may be achieved.

Also, as described above, since internal stress of the warped flexible substrate 11 may be released by performing heat treatment using the heating furnace 100, the hot plate 200, and the oven 300, warpage of the flexible substrate 11 after the carrier substrate 12 may be separated may be suppressed and thus a possibility that a product error is caused while the flexible substrate 11 is handled may be greatly reduced.

Therefore, if the above-described manufacturing method is used, since warpage of a flexible substrate after a carrier substrate and the flexible substrate are separated from each other may be suppressed, a subsequent process may be appropriately performed, productivity may be improved, and damage of products caused while the flexible substrate is handled may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is;

1. A flexible display device manufacturing method comprising:
    preparing a substrate assembly in which a flexible substrate is formed on a carrier substrate;
    vertically stacking a plurality of the prepared substrate assemblies in a heating furnace in multi-stages, said plurality of the prepared substrate assemblies being positioned one above another;
    performing heat treatment by providing hot blast, in which a temperature of the hot blast is gradually increased, onto each of the vertically stacked substrate assemblies in a horizontal direction in a space between adjacent vertically stacked substrate assemblies;
    forming a display unit on the flexible substrate of the heat-treated substrate assembly; and
    separating the flexible substrate and the carrier substrate from each other.

2. The method of claim 1, wherein, in the performing of the heat treatment, the hot blast passes along a flat surface of the flexible substrate of each of the piled substrate assemblies while forming a laminar flow.

3. The method of claim 1, wherein the temperature of the hot blast is gradually increased to a first temperature less than 150° C., to a second temperature equal to or greater than 150° C. and less than 300° C., and to a third temperature equal to or greater than 300° C.

4. The method of claim 1, wherein the flexible substrate comprises a polyimide material, and
    wherein the carrier substrate comprises a glass material.

5. The method of claim 1, further comprising performing post-processing for re-heating the flexible substrate after the flexible substrate and the carrier substrate are separated from each other.

6. The method of claim 5, wherein the post-processing comprises direct heating for allowing a heat source to directly contact the flexible substrate, or indirect heating for putting the flexible substrate in a high-temperature atmosphere for a certain period of time.

7. The method of claim 6, wherein the direct heating is performed by putting the flexible substrate on a hot plate heated to 50 to 150° C., for 1 to 10 min.

8. The method of claim 6, wherein the indirect heating is performed by putting the flexible substrate in an oven that is maintained at 50 to 150° C., for 1 to 5 min.

9. The method of claim 5, wherein the post-processing is selectively performed if warpage of the flexible substrate after the carrier substrate and the flexible substrate are separated from each other is caused.

10. A flexible display device manufacturing method comprising:
    preparing a substrate assembly in which a flexible substrate is formed on a carrier substrate, said flexible substrate is composed of a thin polyimide material and said carrier substrate is composed of a thin glass film;
    stacking vertically a plurality of the prepared substrate assemblies in a heating furnace in multi-stages on separate selves, said plurality of the prepared substrate assemblies being positioned one above another;
    performing heat treatment by providing hot blast onto each of the vertically stacked substrate assemblies in a horizontal direction in a space between adjacent vertically stacked substrate assemblies;

forming a display unit on the flexible substrate of the heat-treated substrate assembly; and separating the flexible substrate and the carrier substrate from each other; and performing selectively post-processing for re-heating the flexible substrate if warp age of the flexible substrate occurs after the carrier substrate and the flexible substrate are separated from each other is caused.

11. The method of claim 10, wherein, in the performing of the heat treatment, the hot blast passes along a flat surface of the flexible substrate of each of the piled substrate assemblies while forming a laminar flow.

12. The method of claim 10, wherein, in the performing of the heat treatment, a temperature of the hot blast is gradually increased.

13. The method of claim 12, wherein the temperature of the hot blast is gradually increased to a first temperature less than 150° C., to a second temperature equal to or greater than 150° C. and less than 300° C., and to a third temperature equal to or greater than 300° C.

14. The method of claim 10, wherein the post-processing comprises direct heating for allowing a heat source to directly contact the flexible substrate, or indirect heating for putting the flexible substrate in a high-temperature atmosphere for a certain period of time.

15. The method of claim 14, wherein the direct heating is performed by putting the flexible substrate on a hot plate heated to 50 to 150° C., for 1 to 10 min.

16. The method of claim 14, wherein the indirect heating is performed by putting the flexible substrate in an oven that is maintained at 50 to 150° C., for 1 to 5 min.

* * * * *